(12) United States Patent
Chan et al.

(10) Patent No.: US 12,155,744 B2
(45) Date of Patent: Nov. 26, 2024

(54) SIGNAL RELAY APPARATUS AND METHOD HAVING FREQUENCY LOCKING MECHANISM

(71) Applicant: REALTEK SEMICONDUCTOR CORPORATION, Hsinchu (TW)

(72) Inventors: Chun-Chieh Chan, Hsinchu (TW);
Tai-Jung Wu, Hsinchu (TW);
Chia-Hao Chang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 62 days.

(21) Appl. No.: 18/206,096

(22) Filed: Jun. 6, 2023

(65) Prior Publication Data
US 2024/0015000 A1 Jan. 11, 2024

(30) Foreign Application Priority Data
Jul. 7, 2022 (TW) .................................. 111125617

(51) Int. Cl.
*H04L 7/033* (2006.01)
*H03L 7/08* (2006.01)

(52) U.S. Cl.
CPC ............ *H04L 7/033* (2013.01); *H03L 7/0807* (2013.01)

(58) Field of Classification Search
CPC ... H04L 7/033; H03L 7/0807; H03L 2207/06; H03L 7/085
See application file for complete search history.

(56) References Cited

U.S. PATENT DOCUMENTS

| 8,665,928 B1 | 3/2014 | Klein et al. | |
| 11,418,756 B2 * | 8/2022 | Chan | H04N 7/015 |
| 2021/0313993 A1 * | 10/2021 | Bai | H04L 7/005 |
| 2023/0046082 A1 * | 2/2023 | Chan | H04L 25/242 |

OTHER PUBLICATIONS

OA letter of a counterpart TW application (appl. No. 111125617) mailed on Aug. 22, 2023. Summary of the TW OA letter: 1. Claims 1-2 and 4-10 are rejected as being anticipated by the disclosure of the cited reference 1 (US 8665928 B1). 2. Claim 3 is rejected as allegedly being unpatentable in view of cited reference 1. Correspondence bewteen claims of TW counterpart application and claims of US application: 1. Claims 1, 2-3, . . . , and 10 in TW counterpart application correspond to claims 1, 2-3, . . . 9 and 11 in US application, respectively.

\* cited by examiner

*Primary Examiner* — Sung S Ahn
(74) *Attorney, Agent, or Firm* — WPAT, P.C.

(57) ABSTRACT

The present disclosure discloses a signal relay apparatus having frequency locking mechanism that includes a receiving circuit, a frequency generation circuit, a frequency tracking circuit and a transmission circuit. The receiving circuit receives a receiving signal to retrieve data included therein according a corresponding receiving frequency signal. The frequency generation circuit receives a source clock signal and generates a target frequency signal according to a conversion parameter. The frequency tracking circuit calculates a frequency difference between the receiving frequency signal and the target frequency signal to adjust the conversion parameter accordingly. The transmission circuit generates a transmission signal that includes the data according to the target frequency signal.

20 Claims, 4 Drawing Sheets

SIGNAL RELAY APPARATUS AND METHOD HAVING FREQUENCY LOCKING MECHANISM

BACKGROUND OF THE INVENTION

1. Field of the Invention

The present disclosure relates to a signal relay apparatus and a signal relay method having frequency locking mechanism.

2. Description of Related Art

For current electronic apparatuses, signal transmission technology has higher demands for transmission speed. Take HDMI 2.1 standard as an example, such a technology defines a new transmission mode called Fixed Rate Link (FRL) in order to increase the transmission bandwidth, in which a handshake process is performed before the actual signal transmission begins to detect whether the quality of the signal transmitted under high speed satisfies the requirement of HDMI 2.1 standard. If the connection based on FRL is successfully established, the highest bandwidth can be up to 12 Gbps.

Under such a condition, when a signal relay apparatus is used to perform high speed data transmission, a clock signal generated by using quartz crystal resonating technology is required to maintain the transmission precision. However, such a configuration increases the cost. How to balance between precision and cost becomes a great challenge in the design of the signal relay apparatus.

SUMMARY OF THE INVENTION

In consideration of the problem of the prior art, an object of the present disclosure is to provide a signal relay apparatus and a signal relay method having frequency locking mechanism.

The present invention discloses a signal relay apparatus having frequency locking mechanism that includes a receiving circuit, a frequency generation circuit, a frequency tracking circuit and a transmission circuit. The receiving circuit is configured to receive a receiving signal and retrieve data included by the receiving signal according to a receiving frequency signal that the receiving signal corresponds to. The frequency generation circuit is configured to receive a source clock signal and generate a target frequency signal according to a conversion parameter. The frequency tracking circuit is configured to calculate a frequency difference between the receiving frequency signal and the target frequency signal and adjust the conversion parameter according to the frequency difference. The transmission circuit is configured to generate a transmission signal that includes the data according to the target frequency signal.

The present invention also discloses a signal relay method having frequency locking mechanism used in a signal relay apparatus that includes steps outlined below. A receiving signal is received and data included by the receiving signal is retrieved according to a receiving frequency signal that the receiving signal corresponds to by a receiving circuit. A source clock signal is received and a target frequency signal is generated according to a conversion parameter by a frequency generation circuit. A frequency difference between the receiving frequency signal and the target frequency signal is calculated and the conversion parameter is adjusted according to the frequency difference by a frequency tracking circuit. A transmission signal that includes the data is generated according to the target frequency signal by a transmission circuit.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide a signal relay apparatus and a signal relay method having frequency locking mechanism to generate a target frequency signal according to a source clock signal so as to perform tracking according to a receiving frequency signal and further perform signal transmission according to a tracking result. An accuracy of the clock signal can be maintained under a low cost condition in which no clock signal generated by using the quartz crystal resonating technology is required.

Figure 1A:
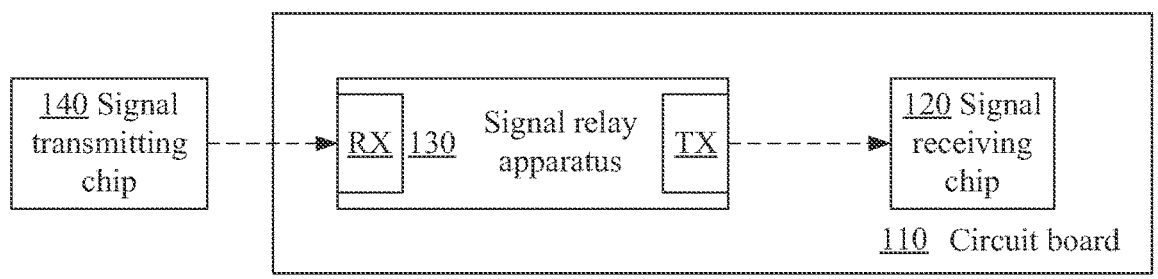
FIG. 1A and FIG. 1B respectively illustrate a block diagram of an electronic apparatus according to an embodiment of the present invention.
Figure 1B:
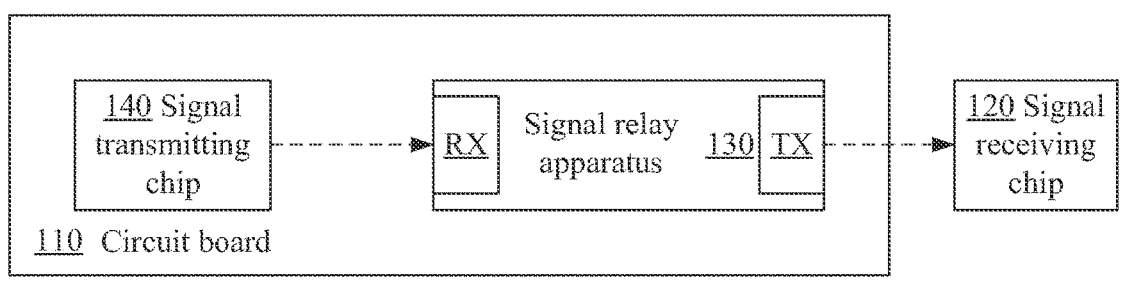

Reference is now made to FIG. 1A and FIG. 1B at the same time. FIG. 1A and FIG. 1B respectively illustrate a block diagram of an electronic apparatus 100 according to an embodiment of the present invention.

In the embodiment of FIG. 1A, the electronic apparatus 100 includes a circuit board 110, a signal receiving chip 120 and a signal relay apparatus 130 having frequency locking mechanism. The signal receiving chip 120 and the signal relay apparatus 130 are disposed on the circuit board 110.

The electronic apparatus 100 can perform communication with another electronic apparatus (not illustrated in the figure) that includes a signal transmitting chip 140 according to one of transmission interface formats of High Definition Multimedia Interface (HDMI), DisplayPort (DP) and Universal Serial Bus (USB) Type-C.

In FIG. 1A, the signal relay apparatus 130 is disposed between the signal receiving chip 120 and the signal transmitting chip 140 and is configured to perform signal relay transmission between the signal receiving chip 120 and the signal transmitting chip 140. For example, the electronic apparatus 100 that includes the signal receiving chip 120 operates as a sink terminal, and is such as but not limited to a device of television or display device. The other electronic apparatus that includes the signal transmitting chip 140 operates as a source terminal and is such as but not limited to a device of a notebook computer or a DVD player. As a result, the signal receiving chip 120 receives the signal from the signal transmitting chip 140 through the signal relay apparatus 130 and performs processing thereon, such as but not limited image signal processing and displaying.

The signal relay apparatus 130 includes a transmission circuit TX and a receiving circuit RX. As illustrated in FIG. 1A, through the dashed line path, the signal relay apparatus 130 can receive signals from the signal transmitting chip 140 by using the receiving circuit RX and transmit signals to the signal receiving chip 120 by using the transmission circuit TX.

On the contrary, in the embodiment of FIG. 1B, the electronic apparatus 100 includes the circuit board 110, the signal transmitting chip 140 and the signal relay apparatus 130 having frequency locking mechanism. The signal transmitting chip 140 and the signal relay apparatus 130 are disposed on the circuit board 110.

The electronic apparatus 100 can perform communication with another electronic apparatus (not illustrated in the figure) that includes the signal receiving chip 120 according to one of transmission interface formats of HDMI, DP and USB Type-C.

In FIG. 1B, the signal relay apparatus 130 is also disposed between the signal receiving chip 120 and the signal transmitting chip 140, and is configured to perform signal relay transmission between the signal receiving chip 120 and the signal transmitting chip 140. For example, the electronic apparatus 100 that includes the signal transmitting chip 140 operates as a source terminal, and is such as but not limited to a device of a notebook computer or a DVD player. The other electronic apparatus that includes the signal receiving chip 120 operates as a sink terminal and is such as but not limited to a device of a television or a display device. As a result, the signal transmitting chip 140 transmits the signal to the signal receiving chip 120 through the signal relay apparatus 130 such that the signal receiving chip 120 performs processing thereon, such as but not limited image signal processing and displaying.

Similarly, the signal relay apparatus 130 includes a transmission circuit TX and a receiving circuit RX. As illustrated in FIG. 1B, through the dashed line path, the signal relay apparatus 130 can receive signals from the signal transmitting chip 140 by using the receiving circuit RX and transmit signals to the signal receiving chip 120 by using the transmission circuit TX.

The signal relay apparatus 130 performs signal relay transmission according to the transmission interface format of the signal receiving chip 120 and the signal transmitting chip 140 to avoid the signal attenuation generated due to a connection wire (e.g., HDMI wire) or a circuit board interconnection between the signal receiving chip 120 and the signal transmitting chip 140 being too long.

For example, the signal relay apparatus 130 performs signal relay transmission according to one of the transmission interface formats of HDMI, DP and USB. In different embodiments, the signal relay apparatus 130 can be implemented in the form of a retimer or a redriver.

It is appreciated that the configuration that disposes the signal relay apparatus 130 between the signal receiving chip 120 and the signal transmitting chip 140 is merely an example. In other embodiments, the signal relay apparatus 130 can be disposed in any two circuits included in the electronic apparatus 100 or can be disposed on yet another circuit board different from the circuit board that the signal receiving chip 120 and the signal transmitting chip 140 are disposed on.

Further, in other embodiments, the signal relay apparatus 130 can be disposed in another electronic apparatus between the signal receiving chip 120 and the signal transmitting chip 140.

The configuration and operation of the signal relay apparatus 130 are described in detail in the following paragraphs.

Figure 2:
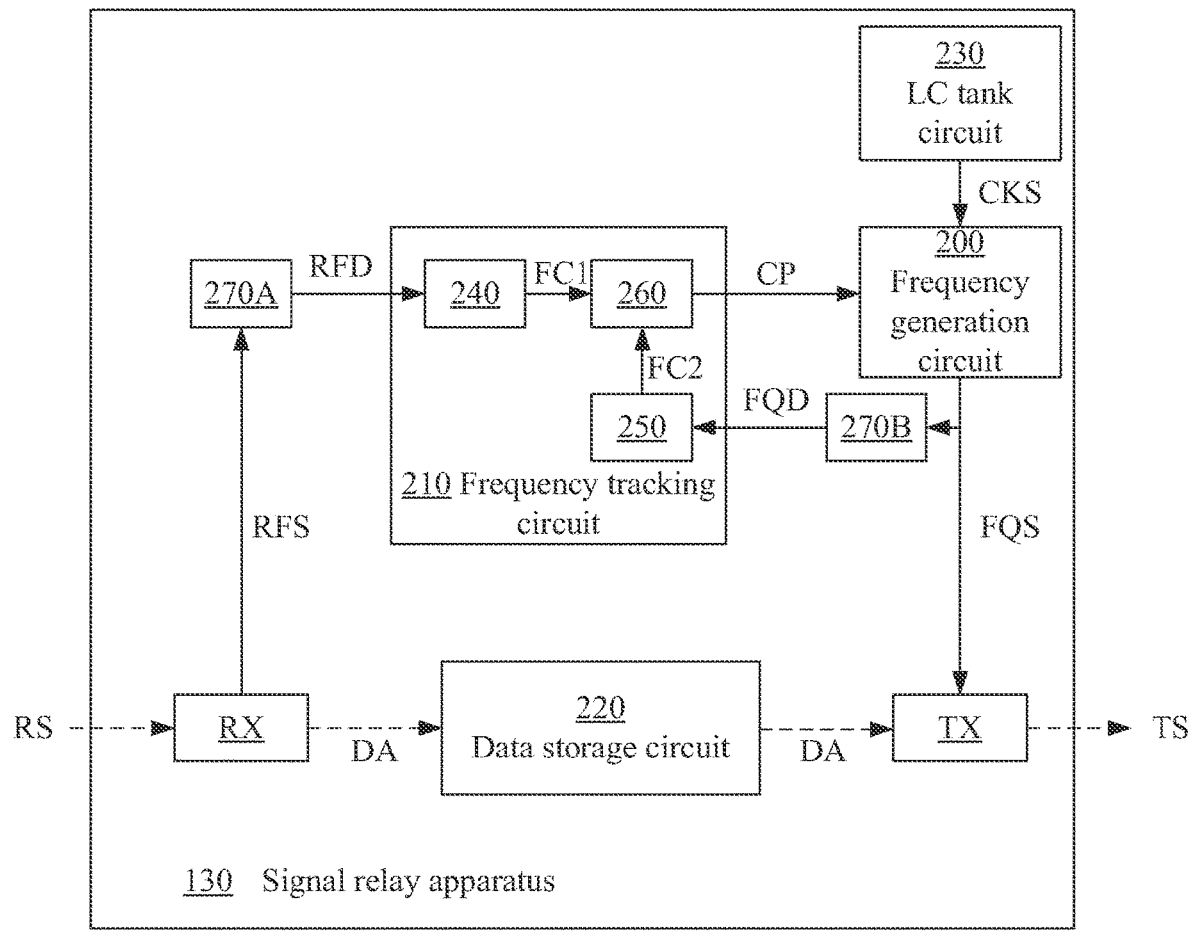
FIG. 2 illustrates a detailed circuit diagram of the signal relay apparatus according to an embodiment of the present invention.

Reference is now made to FIG. 2. FIG. 2 illustrates a detailed circuit diagram of the signal relay apparatus 130 according to an embodiment of the present invention.

As illustrated in FIG. 2, besides the transmission circuit TX and the receiving circuit RX, the signal relay apparatus 130 further includes a frequency generation circuit 200, a frequency tracking circuit 210 and a data storage circuit 220.

The receiving circuit RX is configured to receive a receiving signal that satisfies an offset requirement and retrieves the data DA included by the receiving signal RS according to a receiving frequency signal RFS that the receiving signal RS corresponds to. The offset requirement can be a requirement of a condition that an offset in each of a range of a predetermined Hertz does not exceed a predetermined value of Hertz. In a numerical example, the offset requirement can be a requirement of a condition that an offset in each of a range of 1 Megahertz (MHz) does not exceed 300 Hz.

In an embodiment, the receiving circuit RX includes such as, but not limited to a clock and data recovery (CDR) circuit and a sampling circuit (not illustrated in the figure) to perform clock and data recovery on the receiving signal RS to generate the receiving frequency signal RFS and sample the receiving signal RS according to the receiving frequency signal RFS to generate the data DA. In practical implementation, the receiving circuit RX may include more circuits to perform filtering or other digital processing on the signals. The present invention is not limited to a certain circuit configuration.

The frequency generation circuit 200 is configured to receive a source clock signal CKS and generate a target frequency signal FQS according to a conversion parameter CP. The source clock signal CKS is generated according to a non-quartz crystal resonating technology. In the present embodiment, the source clock signal CKS is generated by such as, but not limited to a LC tank circuit 230 further included by the signal relay apparatus 130 according to a non-quartz crystal resonating technology.

In an embodiment, in a system initialization stage, the frequency tracking circuit 210 can set an initial value of the conversion parameter CP such that the target frequency signal FQS has an initial frequency value. Subsequently, the frequency tracking circuit 210 is configured to calculate a frequency difference between the receiving frequency signal RFS and the target frequency signal FQS and adjust the conversion parameter CP accordingly.

In an embodiment, the frequency tracking circuit 210 may respectively perform frequency division on the receiving frequency signal RFS and the target frequency signal FQS, respectively perform counting on the frequency division result of each of the receiving frequency signal RFS and the target frequency signal FQS to generate frequency count values, subtract the frequency count values from each other to calculate the frequency difference and adjust the conversion parameter CP according to the frequency difference. The detailed operation of the frequency tracking circuit 210 and the corresponding frequency division mechanism are described in the following paragraphs.

As illustrated in FIG. 2, in the present embodiment, the frequency tracking circuit 210 includes a first counting circuit 240, a second counting circuit 250 and an adjusting circuit 260.

The first counting circuit 240 is configured to perform counting of such as, but not limited to cycle counts according to the receiving frequency signal RFS to generate a first frequency count value FC1. In an embodiment, the signal relay apparatus 130 further includes a frequency division circuit 270A configured to perform frequency division on the receiving frequency signal RFS to generate a receiving frequency signal after the frequency division RFD. The first counting circuit 240 actually performs counting on the frequency division result of the receiving frequency signal RFS, i.e., the receiving frequency signal after the frequency division RFD.

In a numerical example, an order of the receiving frequency signal RFS can be such as, but not limited to Gigahertz (GHz). An order of the receiving frequency signal after the frequency division RFD generated after the frequency division can be such as, but not limited to several hundreds of MHz.

The second counting circuit 250 is configured to perform counting of such as, but not limited to cycle counts according to the target frequency signal FQS to generate a second frequency count value FC2. In an embodiment, the signal relay apparatus 130 further includes a frequency division circuit 270B configured to perform frequency division on the target frequency signal FQS to generate a target frequency signal after the frequency division FQD. The second counting circuit 250 actually performs counting on the frequency division result of the target frequency signal FQS, i.e., the target frequency signal after the frequency division FQD.

In a numerical example, an order of the target frequency signal FQS can be such as, but not limited to GHz. An order of the target frequency signal after the frequency division FQD generated after the frequency division can be such as, but not limited to several hundreds of MHz.

The adjusting circuit 260 is configured to calculate the frequency difference according to the first frequency count value FC1 and the second frequency count value FC2 and adjust the conversion parameter CP according to the frequency difference.

In an embodiment, the adjusting circuit 260 is configured to start to calculate the frequency difference when any one of the first frequency count value FC1 and the second frequency count value FC2 reaches a predetermined value. For example, when any one of the first frequency count value FC1 and the second frequency count value FC2 reaches 1000 cycle counts, the frequency difference is started to be calculated.

For example, when the first frequency count value FC1 reaches 1000 cycle counts and the second frequency count value FC2 reaches 950 cycle counts at the same time, the frequency difference (50 cycle counts) calculated accordingly indicates that the receiving frequency signal RFS leads the target frequency signal FQS. Under such a condition, the adjusting circuit 260 generates the conversion parameter CP such that the frequency generation circuit 200 controls the target frequency signal FQS to perform forward tracking, i.e., increasing the target frequency signal FQS.

When the second frequency count value FC2 reaches 1000 cycle counts and the first frequency count value FC1 reaches 930 cycle counts at the same time, the frequency difference (−70 cycle counts) calculated accordingly indicates that the receiving frequency signal RFS lags the target frequency signal FQS. Under such a condition, the adjusting circuit 260 generates the conversion parameter CP such that the frequency generation circuit 200 controls the target frequency signal FQS to perform backward tracking, i.e., decreasing the target frequency signal FQS.

The target frequency of the target frequency signal FQS is not necessarily equal to the receiving frequency of the receiving frequency signal RFS, in which different amounts of the target frequency can be generated depending on the requirement of the transmission circuit TX. Nevertheless, by using the frequency division circuit 270A and the frequency division circuit 270B, the adjusting circuit 260 can still perform comparison on the target frequency signal FQS and the receiving frequency signal RFS based on the frequency division results thereof having the same order to calculate the frequency difference and generate the conversion parameter CP accordingly.

It is appreciated that the calculation method of the frequency difference described above is merely an example. In other embodiments, the adjusting circuit 260 may also use other methods to calculate the frequency difference between the target frequency signal FQS and the receiving frequency signal RFS.

In an embodiment, the adjusting circuit 260 may dynamically modify the conversion parameter CP according to the amount of the frequency difference such that the adjusting amount that the conversion parameter CP performs on the target frequency signal FQS is dynamically modified as well.

Figure 3:
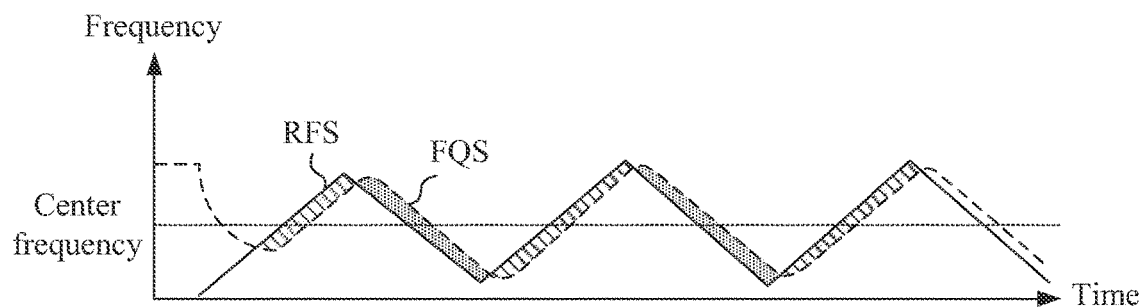
FIG. 3 illustrates a waveform diagram of the receiving frequency signal and the target frequency signal according to an embodiment of the present invention.

Reference is now made to FIG. 3. FIG. 3 illustrates a waveform diagram of the receiving frequency signal RFS and the target frequency signal FQS according to an embodiment of the present invention.

In FIG. 3, the X-axis stands for time and the Y-axis stands for frequency. As illustrated in FIG. 3, the waveform of the receiving frequency signal RFS is illustrated by a solid line and the waveform of the target frequency signal FQS is illustrated by a dashed line. Due to the spread spectrum of the signal, the center frequency of receiving frequency signal RFS drifts up and down such that the target frequency signal FQS tracks the receiving frequency signal RFS. Each of the areas between the two waveforms having slash lines therein indicates the condition that the receiving frequency signal RFS leads the target frequency signal FQS. Each of the areas between the two waveforms having dots therein indicates the condition that the receiving frequency signal RFS lags the target frequency signal FQS.

In an embodiment, when the frequency difference is smaller than a predetermined frequency difference value, the adjusting circuit 260 of the frequency tracking circuit 210 in FIG. 2 adjusts the conversion parameter CP such that the adjusting amount that the conversion parameter CP performs on the target frequency signal FQS is smaller than a predetermined adjusting amount.

More specifically, the frequency difference between the target frequency signal FQS and the receiving frequency signal RFS is smaller around the timing that the waveforms of the target frequency signal FQS and the receiving frequency signal RFS intersect (around the turning points of the waveforms). Under such a condition, if the adjusting amount that the conversion parameter CP performs on the target frequency signal FQS is too large, an overshoot or an undershoot easily occurs to the target frequency signal FQS. As a result, by decreasing the adjusting amount when the frequency difference is smaller than the predetermined frequency difference value, the adjusting circuit 260 can make the waveform of the target frequency signal FQS at the turning points smoother.

Reference is now made to FIG. 2 again. The data storage circuit 220 may include a memory. The data storage circuit 220 is configured to store the data DA retrieved from the receiving signal RS in the memory by the receiving circuit RX. The transmission circuit TX is configured to retrieve the data DA from the memory of the data storage circuit 220 to generate the transmission signal TS that includes the data DA according to the target frequency signal FQS. As a result, the transmission circuit TX can perform signal relay transmission according to the target frequency signal FQS through the transmission interface format described above (e.g., HDMI, DP or USB Type-C).

In an embodiment, the transmission circuit TX may determine the speed of retrieving the data DA to generate the transmission signal TS according to the target frequency signal FQS.

More specifically, during the process that the frequency tracking circuit 210 tracks the receiving frequency signal RFS, the condition that the target frequency signal FQS leads the receiving frequency signal RFS and the condition that the target frequency signal FQS lags the receiving frequency signal RFS are unavoidable.

When the frequency difference indicates that the target frequency signal FQS leads the receiving frequency signal RFS, the data storage circuit 220 consumes the data DA stored in advance and the frequency tracking circuit 210 performs backward tracking to decrease the speed that the transmission circuit TX retrieves the data DA. The condition that the data storage circuit 220 becomes empty and is not able to provide data for transmission generated due to the speed that the transmission circuit TX retrieves the data DA is too high can be avoided.

In an embodiment, when the system is initialized, the data storage circuit 220 is activated after the frequency tracking mechanism of the frequency tracking circuit 210 becomes stable. After receiving the data DA and verifying that the storage amount of the data DA reaches a target value (e.g., a half of the total storage amount of the data storage circuit 220), the data storage circuit 220 starts to allow the transmission circuit TX to retrieve and output the data DA.

On the other hand, when the frequency difference indicates that the target frequency signal FQS lags the receiving frequency signal RFS, the data storage circuit 220 stores the data DA that is not transmitted yet, and the frequency tracking circuit 210 performs forward tracking to increase the speed that the transmission circuit TX retrieves the data DA. The condition that the data storage circuit 220 is fully and is not able to store new data such that the new data is lost generated due to the speed that the transmission circuit TX retrieves the data DA is too low can be avoided.

In HDMI 2.1 standard, an requirement of the transmission terminal is presented that an offset in a range of 1 MHz is not allowed to exceed 300 Hertz (300 parts per million (ppm)). As a result, when the receiving signal RS that the receiving circuit RX receives already satisfy the offset requirement, the signal relay apparatus 130 can generate the initial target frequency signal FQS according to the source clock signal CKS generated according to the non-quartz crystal resonating technology by using the frequency generation circuit 200 and perform tracking by using the frequency tracking circuit 210 subsequently.

Even though the source clock signal CKS is not generated according to the quartz crystal resonating technology, the frequency tracking circuit 210 can still generate the target frequency signal FQS that satisfies the offset requirement by tracking the receiving signal RS such that the signal transmission performed by the transmission circuit TX can also satisfy the offset requirement that the offset is not allowed to exceed 300 Hertz in the range of 1 MHz.

It is appreciated that the numerical examples described above is based on HDMI 2.1 standard. In other transmission interface formats of HDMI, DP and USB Type-C, other ranges of the offset requirement can be used. The present invention is not limited to a certain value of the offset requirement.

Figure 4:
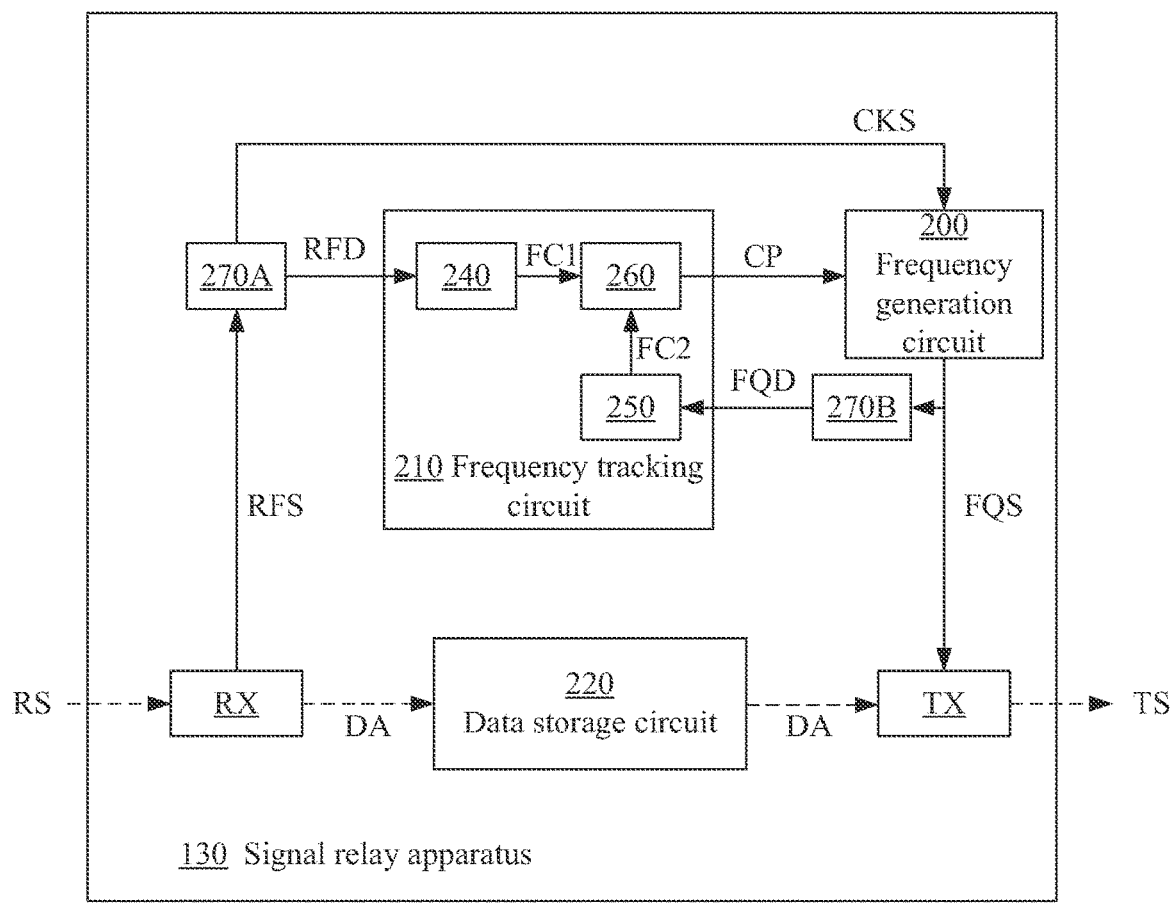
FIG. 4 illustrates a detailed circuit diagram of the signal relay apparatus according to another embodiment of the present invention.

Reference is now made to FIG. 4. FIG. 4 illustrates a detailed circuit diagram of the signal relay apparatus 130 according to another embodiment of the present invention.

The signal relay apparatus 130 illustrated in FIG. 4 is similar to the signal relay apparatus 130 illustrated in FIG. 2. The identical components are not further described herein. In the present embodiment, the signal relay apparatus 130 does not include the LC tank circuit 230. The source clock signal CKS that the frequency generation circuit 200 receives is generated based on a frequency division result of the receiving frequency signal RFS. More specifically, the frequency division performed on the receiving frequency signal RFS by the frequency division circuit 270A not only generates the receiving frequency signal after the frequency division RFD but also generates the source clock signal CKS.

In an embodiment, the frequency division circuit 270A may perform frequency division on the receiving frequency signal RFS with different divisors based on application requirements. In a numerical example, the receiving frequency signal after the frequency division RFD generated by the frequency division circuit 270A can be in the order of such as but not limited to several hundreds MHz, and the source clock signal CKS generated by the frequency division circuit 270A can be in the order of such as but not limited to several dozens MHz.

It is appreciated that in FIG. 4, a single frequency division circuit 270A is used to perform frequency division. In other embodiments, the signal relay apparatus 130 may dispose two frequency division circuits, in which a first one performs frequency division on the receiving frequency signal RFS to generate the receiving frequency signal after the frequency division RFD and a second one further performs frequency division on the receiving frequency signal after the frequency division RFD to generate the source clock signal CKS. The present invention is not limited thereto.

In the present embodiment, since the source clock signal CKS received by the frequency generation circuit 200 is directly generated according to the receiving signal RS such that the frequency tracking circuit 210 performs tracking on the receiving signal RS according to the target frequency signal FQS generated by frequency generation circuit 200 based on the source clock signal CKS, the signal transmission performed by the transmission circuit TX can further satisfy the offset requirement with greater accuracy.

As a result, the signal relay apparatus having frequency locking mechanism generates a target frequency signal according to a source clock signal so as to perform tracking according to a receiving frequency signal and further perform signal transmission according to a tracking result. An accuracy of the clock signal can be maintained under a low cost condition in which no clock signal generated by quartz crystal resonating technology is required.

Figure 5:
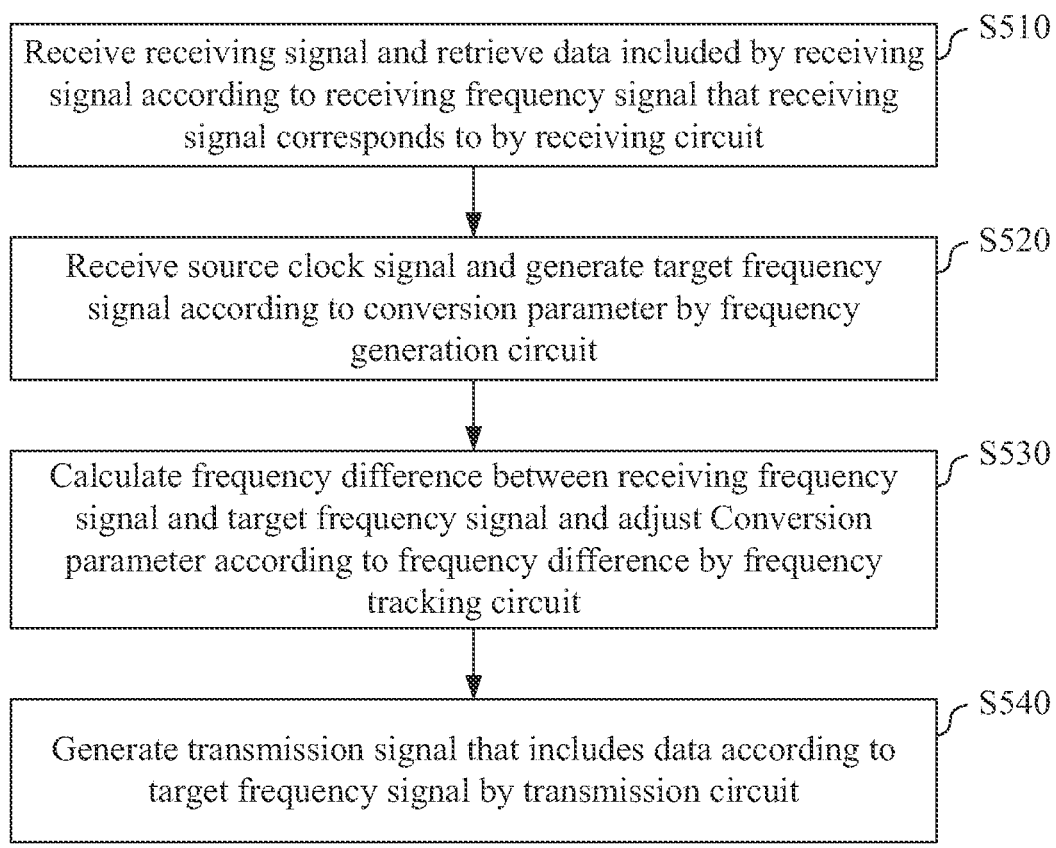
FIG. 5 illustrates a flow chart of a signal relay method having frequency locking mechanism according to an embodiment of the present invention.

Reference is now made to FIG. 5. FIG. 5 illustrates a flow chart of a signal relay method 500 having frequency locking mechanism according to an embodiment of the present invention.

Besides the apparatus described above, the present invention further discloses the signal relay method 500 that can be used in such as, but not limited to the signal relay apparatus 130 illustrated in FIG. 2. An embodiment of the signal relay method 500 is illustrated in FIG. 5 and includes the steps outlined below.

In step S510, the receiving signal RS is received and the data DA included by the receiving signal RS is retrieved according to the receiving frequency signal RFS that the receiving signal RS corresponds to by the receiving circuit RX.

In step S520, the source clock signal CKS is received and the target frequency signal FQS is generated according to the conversion parameter CP by the frequency generation circuit 200.

In step S530, the frequency difference between the receiving frequency signal RFS and the target frequency signal FQS is calculated and the conversion parameter CP is adjusted according to the frequency difference by the frequency tracking circuit 210.

In step S540, the transmission signal TS that includes the data DA is generated according to the target frequency signal FQS by the transmission circuit TX.

It is appreciated that the embodiments described above are merely an example. In other embodiments, it is appreciated that many modifications and changes may be made by those of ordinary skill in the art without departing, from the spirit of the invention.

In summary, the signal relay apparatus and the signal relay method having frequency locking mechanism generate a target frequency signal according to a source clock signal so as to perform tracking according to a receiving frequency signal and further perform signal transmission according to a tracking result. An accuracy of the clock signal can be maintained under a low cost condition in which no clock signal generated by quartz crystal resonating technology is required.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A signal relay apparatus having frequency locking mechanism, comprising:
a receiving circuit configured to receive a receiving signal and retrieve data comprised by the receiving signal according to a receiving frequency signal that the receiving signal corresponds to;
a frequency generation circuit configured to receive a source clock signal and generate a target frequency signal according to a conversion parameter;
a frequency tracking circuit configured to calculate a frequency difference between the receiving frequency signal and the target frequency signal and adjust the conversion parameter according to the frequency difference; and
a transmission circuit configured to generate a transmission signal that comprises the data according to the target frequency signal.

2. The signal relay apparatus of claim 1, wherein the source clock signal is generated according to a non-quartz crystal resonating technology.

3. The signal relay apparatus of claim 2, wherein the source clock signal is generated by a LC tank circuit or by dividing a frequency of the receiving frequency signal.

4. The signal relay apparatus of claim 1, wherein the receiving circuit is further configured to perform clock and data recovery on the receiving signal to generate the receiving frequency signal and sample the receiving signal according to the receiving frequency signal to generate the data.

5. The signal relay apparatus of claim 1, wherein the frequency tracking circuit comprises:
a first counting circuit configured to perform counting according to the receiving frequency signal to generate a first frequency count value;
a second counting circuit configured to perform counting according to the target frequency signal to generate a second frequency count value; and
an adjusting circuit configured to calculate the frequency difference according to the first frequency count value and the second frequency count value and adjust the conversion parameter according to the frequency difference.

6. The signal relay apparatus of claim 5, wherein the first counting circuit and the second counting circuit respectively perform counting on a frequency division result of each of the receiving frequency signal and the target frequency signal.

7. The signal relay apparatus of claim 1, wherein when the frequency difference is smaller than a predetermined frequency difference value, the frequency tracking circuit adjusts the conversion parameter such that an adjusting amount that the conversion parameter performs on the target frequency signal is smaller than a predetermined adjusting amount.

8. The signal relay apparatus of claim 1, further comprising a data storage circuit configured to store the data retrieved from the receiving signal by the receiving circuit, and the transmission circuit retrieves the data from the data storage circuit to generate the transmission signal.

9. The signal relay apparatus of claim 8, wherein when the frequency difference indicates that the target frequency signal leads the receiving frequency signal, the data storage circuit consumes the data stored in advance and the frequency tracking circuit performs backward tracking to decrease the speed that the transmission circuit retrieves the data; and
when the frequency difference indicates that the target frequency signal lags the receiving frequency signal, the frequency tracking circuit performs forward tracking to increase the speed that the transmission circuit retrieves the data.

10. The signal relay apparatus of claim 1, wherein the signal relay apparatus is a retimer or a redriver and performs signal relay transmission according to one of transmission interface formats of High Definition Multimedia Interface (HDMI), DisplayPort (DP) and Universal Serial Bus (USB).

11. A signal relay method having frequency locking mechanism used in a signal relay apparatus, comprising:
receiving a receiving signal and retrieving data comprised by the receiving signal according to a receiving frequency signal that the receiving signal corresponds to by a receiving circuit;
receiving a source clock signal and generating a target frequency signal according to a conversion parameter by a frequency generation circuit;

calculating a frequency difference between the receiving frequency signal and the target frequency signal and adjusting the conversion parameter according to the frequency difference by a frequency tracking circuit; and generating a transmission signal that comprises the data according to the target frequency signal by a transmission circuit.

12. The signal relay method of claim 11, wherein the source clock signal is generated according to a non-quartz crystal resonating technology.

13. The signal relay method of claim 12, wherein the source clock signal is generated by a LC tank circuit or by dividing a frequency of the receiving frequency signal.

14. The signal relay method of claim 11, further comprising:

performing clock and data recovery on the receiving signal to generate the receiving frequency signal and sampling the receiving signal according to the receiving frequency signal to generate the data by the receiving circuit.

15. The signal relay method of claim 11, further comprising:

performing counting according to the receiving frequency signal to generate a first frequency count value by a first counting circuit;

performing counting according to the target frequency signal to generate a second frequency count value by a second counting circuit; and calculating the frequency difference according to the first frequency count value and the second frequency count value and adjusting the conversion parameter according to the frequency difference by an adjusting circuit.

16. The signal relay method of claim 15, further comprising:

respectively performing counting on a frequency division result of each of the receiving frequency signal and the target frequency signal by the first counting circuit and the second counting circuit.

17. The signal relay method of claim 11, further comprising:

when the frequency difference is smaller than a predetermined frequency difference value, adjusting the conversion parameter by the frequency tracking circuit such that an adjusting amount that the conversion parameter performs on the target frequency signal is smaller than a predetermined adjusting amount.

18. The signal relay method of claim 11, further comprising:

storing the data, retrieved from the receiving signal by the receiving circuit, by a data storage circuit further comprised by the signal relay apparatus, and retrieving the data from the data storage circuit to generate the transmission signal by the transmission circuit.

19. The signal relay method of claim 18, further comprising:

when the frequency difference indicates that the target frequency signal leads the receiving frequency signal, consuming the data stored in advance by the data storage circuit and performing backward tracking to decrease the speed that the transmission circuit retrieves the data by the frequency tracking circuit; and when the frequency difference indicates that the target frequency signal lags the receiving frequency signal, performing forward tracking to increase the speed that the transmission circuit retrieves the data by the frequency tracking circuit.

20. The signal relay method of claim 11, wherein the signal relay apparatus is a retimer or a redriver and performs signal relay transmission according to one of transmission interface formats of HDMI, DP and USB.

* * * * *